(12) United States Patent
Eissa et al.

(10) Patent No.: US 11,616,011 B2
(45) Date of Patent: Mar. 28, 2023

(54) IC HAVING TRENCH-BASED METAL-INSULATOR-METAL CAPACITOR

(71) Applicant: Texas Instruments Incorporated, Dallas, TX (US)

(72) Inventors: Mona M. Eissa, Allen, TX (US); Umamaheswari Aghoram, Richardson, TX (US); Pushpa Mahalingam, Richardson, TX (US); Erich Wesley Kinder, Plano, TX (US); Bhaskar Srinivasan, Allen, TX (US); Brian E. Goodlin, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 56 days.

(21) Appl. No.: 17/360,183

(22) Filed: Jun. 28, 2021

(65) Prior Publication Data

US 2021/0327802 A1    Oct. 21, 2021

Related U.S. Application Data

(62) Division of application No. 16/564,849, filed on Sep. 9, 2019, now Pat. No. 11,075,157.

(51) Int. Cl.
*H01L 23/522*  (2006.01)
*H01L 49/02*  (2006.01)
*H01L 21/768*  (2006.01)

(52) U.S. Cl.
CPC .... *H01L 23/5223* (2013.01); *H01L 21/76816* (2013.01); *H01L 21/76877* (2013.01); *H01L 23/5226* (2013.01); *H01L 28/40* (2013.01)

(58) Field of Classification Search
CPC .......... H01L 23/5223; H01L 21/76816; H01L 21/76877; H01L 28/40
See application file for complete search history.

(56) References Cited

U.S. PATENT DOCUMENTS 7,956,400 B2    6/2011    Smith

*Primary Examiner* — Anthony Ho
(74) *Attorney, Agent, or Firm* — Jacqueline J. Garner; Frank D. Cimino

(57) ABSTRACT

An integrated circuit (IC) includes a semiconductor surface layer of a substrate including circuitry formed in the semiconductor surface layer configured together with a Metal-Insulator-Metal (MIM) capacitor. A multi-layer metal stack on the semiconductor surface layer includes a bottom plate contact metal layer including a bottom capacitor plate contact. A first interlevel dielectric (ILD) layer is over the bottom plate contact metal layer. The MIM capacitor includes a trench in the first ILD layer over the bottom capacitor plate contact, wherein the trench is lined by a bottom capacitor plate with a capacitor dielectric layer thereon, and a top capacitor plate on the capacitor dielectric layer. A fill material fills the trench to form a filled trench. A second ILD layer is over the filled trench. A filled via through the second ILD layer provides a connection to the top capacitor plate.

25 Claims, 14 Drawing Sheets

IC HAVING TRENCH-BASED METAL-INSULATOR-METAL CAPACITOR

CROSS-REFERENCE TO RELATED APPLICATIONS

This application is a divisional of U.S. Nonprovisional patent application Ser. No. 16/564,849, filed Sep. 9, 2019, the content of which is herein incorporated by reference in its entirety.

FIELD

This Disclosure relates integrated circuit (IC) devices having non-planar Metal-Insulator-Metal capacitors.

BACKGROUND

A Metal-Insulator-Metal (MIM) capacitor is generally considered to be an important passive component in IC devices including Radio Frequency (RF) and analog ICs. MIM capacitors have attracted attention because of their high capacitance density that provides a relatively small chip area which increases circuit density, and further reduces the IC fabrication cost.

For example, advanced analog circuit applications may need precision capacitors which have voltage linearity of less than ±1 part per million (ppm) and a capacitance density larger than 1 fF/μm$^2$. The typical capacitance-voltage (CV) relationship of precision capacitors can be analytically expressed in terms of two voltage coefficients, linear ($\beta$) and quadratic ($\alpha$). For materials used in current state-of-art precision capacitors these coefficients that determine the voltage linearity, one may assume a value for $\beta$ ranging from ±1 to ±20, and a value for $\alpha$ ranging between ±3 to ±4. While the absolute value of the voltage coefficients that are even lower than the ones quoted above can be achieved, this results in much lower capacitance densities. However, as device dimensions scale to meet market trends it is important that capacitance densities increase to enable the reduction of semiconductor chip area. Conventional MIM capacitors have a parallel plate planar structure.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include an IC comprising a semiconductor surface layer of a substrate including circuitry comprising circuit elements formed in the semiconductor surface layer configured together with a Metal-Insulator-Metal (MIM) capacitor. A multi-layer metal stack on the semiconductor surface layer includes a bottom plate contact metal layer that includes a bottom capacitor plate contact. A first interlevel dielectric (ILD) layer is over the bottom plate contact metal layer. The MIM capacitor includes a trench in the first ILD layer over the bottom capacitor plate contact, wherein the trench is lined by a bottom capacitor plate with a capacitor dielectric layer thereon, and atop capacitor plate is on the capacitor dielectric layer. A fill material fills the trench to form a filled trench. A second ILD layer is over including the filled trench. A filled via through the second ILD provides a contact to the top capacitor plate.

BRIEF DESCRIPTION OF THE DRAWINGS

Reference will now be made to the accompanying drawings, which are not necessarily drawn to scale, wherein:

FIG. 2G shows a completed trench-based MIM capacitor, according to an example aspect.

DETAILED DESCRIPTION

Figure 1:
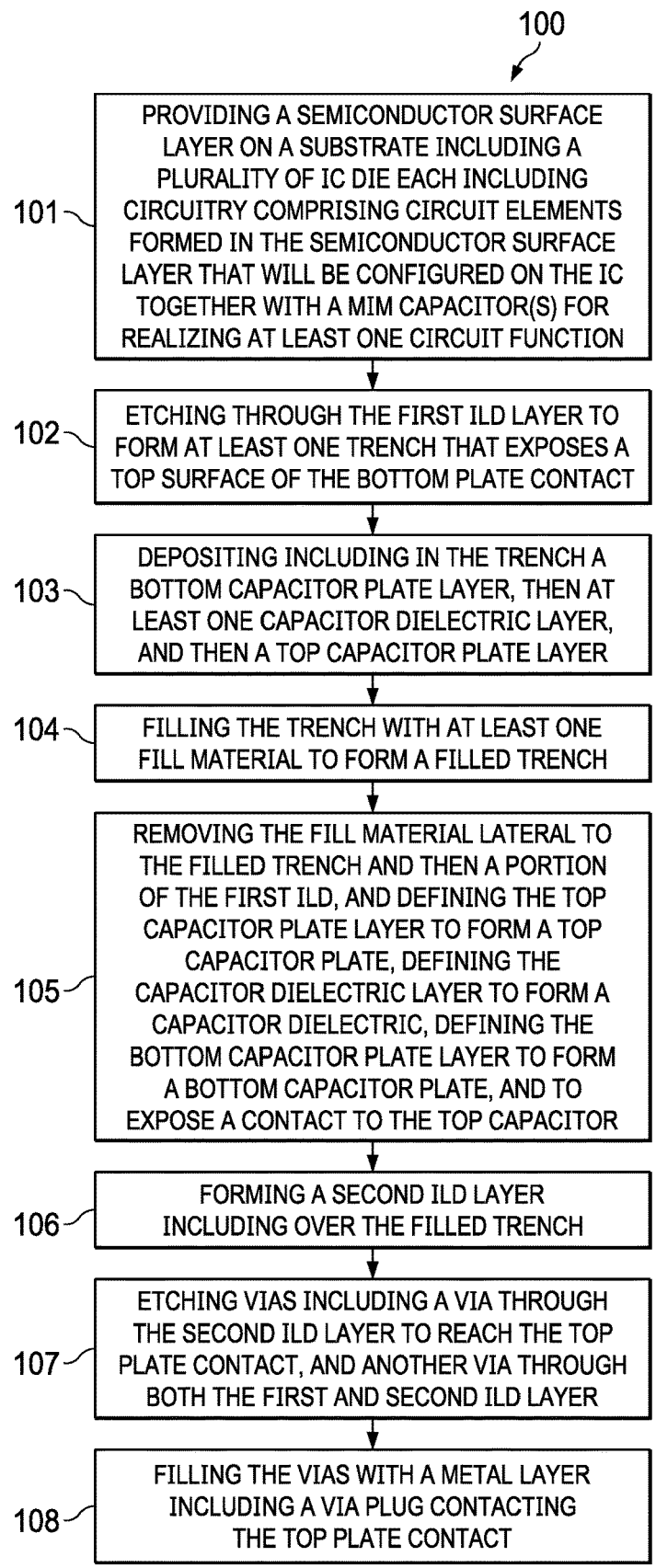
FIG. 1 is a flow chart that shows steps in an example method of fabricating ICs including at least one trench-based MIM capacitor, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize for saving chip area, it is desirable to provide an IC with an array of non-planar MIM capacitor(s) that unlike planar capacitors include additional sidewall capacitance from their 4 walls for providing a higher capacitance (C) per unit area (C/A) beyond the C/A provided by a conventional planar MIM capacitor structure. The C/A value for disclosed trench-based MIM capacitors is generally 2 to 10 fF/μm$^2$. The trench-based MIM capacitor structures can optionally be formed on field oxidation, such as on shallow trench isolation (STI) or on LOCal Oxidation of Silicon (LOCOS).

Figure 2A:
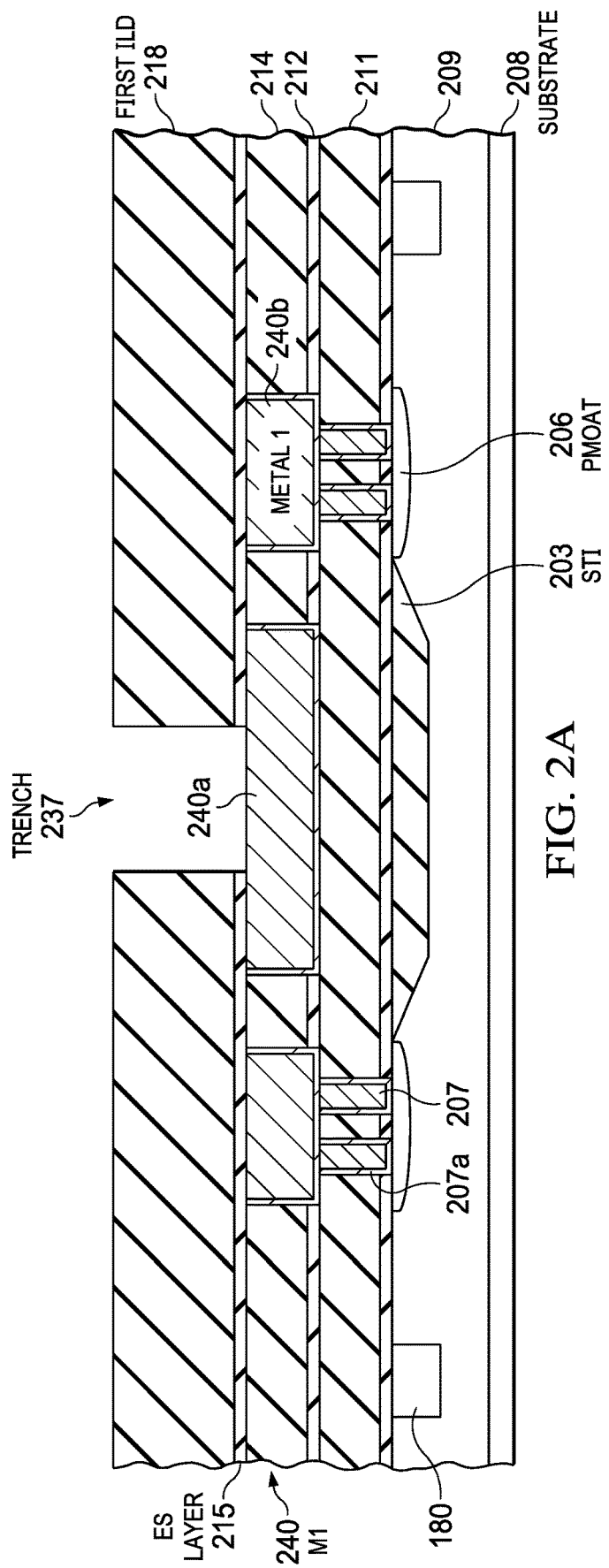
FIGS. 2A-G show successive cross-sectional depictions for a first flow option for forming an example trench-based MIM capacitor on an IC that utilizes a metal fill for the fill material, where

FIG. 1 is a flow chart that shows steps in an example method 100 of fabricating ICs generally on wafer including a plurality of IC die each including at least one trench-based MIM capacitor including a filled trench. FIG. 2G described below shows an IC (shown as IC 200) having a completed trench-based MIM capacitor that includes shows features along with the reference numbers used below to describe method 100. More generally, a disclosed trench-based MIM comprises a plurality of electrically inter-connected filled trenches (see FIG. 4 described below). As used herein the top and bottom metal plates of the trench-based MIM capacitor besides comprising a metal or a metal alloy can also include non-metal atoms, such as N (TaN or TiN) or Si. For example, the bottom plate can comprise TaN, Ti/TiN, TiN, Ni, Pt, Co, CoSi, or Ir, tungsten nitride (WN), or WCN (where WN or WCN can also that can act as a Cu diffusion barrier), and the top plate can also comprise TaN, TiN, Ni, Pt, Co, CoSi, or Ir.

Step 101 comprises providing a semiconductor surface layer 209 (e.g., comprising an epitaxial layer) on a substrate 208 generally in the form of a wafer including a plurality of IC die each including circuitry 180 comprising circuit elements formed in the semiconductor surface layer 209 that will be configured on the IC 200 together with the MIM capacitor(s) 220 for realizing at least one circuit function. The functional circuitry 180 comprises circuit elements (including transistors, and generally diodes, resistors, capacitors, etc.) formed in the semiconductor surface layer 209 configured together with trench-based MIM capacitor(s) 220 for realizing at least one circuit function. Example circuit functions include analog (e.g., amplifier or power converter), radio frequency (RF), digital, or non-volatile memory functions.

A bottom plate contact metal layer includes a bottom plate contact 240a, shown herein by example only as the metal 1 (M1) layer 240, that has a first inter level dielectric (ILD) layer 218 and a second ILD layer 219 over the M1 240. Although described as being the M1 layer 240, the bottom plate metal contact layer can be any metal interconnect level except the top metal level. Disclosed metal levels may comprise copper. However, disclosed aspects have no such limitation to copper metal levels.

FIGS. 2A-G show a pre-metal dielectric (PMD) layer 211 over the semiconductor surface layer 209 shown as a p-epi layer, with an etch stop layer 212 on the PMD layer 211. A PMD capping dielectric layer 214 is on the etch stop layer 212, with the bottom plate contact metal layer shown as M1 layer 240 shown damascened into the PMD capping dielectric layer 214. There is also shown in etch stop layer 215 over the PMD capping dielectric layer 214 and the M1 layer.

Plates of disclosed trench-based MIM capacitors are generally coupled to nodes in the circuitry 180. However, it is also possible for plates of the trench-based MIM capacitor to be provided as separate pins of an IC. Example circuit functions include analog (e.g., amplifier or power converter), radio frequency (RF), digital, or non-volatile memory functions. The substrate 208 and/or semiconductor surface layer 209 can comprise silicon, silicon-germanium, or another semiconductor material.

The capability of the circuitry 180 provided on a disclosed IC may vary, for example ranging from a simple device to a complex device. The specific functionality contained within the circuitry 180 is not of importance to disclosed ICs. The circuitry is generally formed in the semiconductor surface layer 209 of the substrate 208 before forming the trench-based MIM cap(s).

Steps 102-108 described below form the trench-based MIM capacitor on the bottom plate contact. FIG. 2A is a cross-sectional view of the in-process IC after step 102 comprising etching through the first ILD layer 218 to form at least one trench 237 that exposes a top surface of the bottom plate contact 240a. The first ILD layer 218 can be 2 kA to 7 kA thick, such as about 3 kA thick. Step 102 etching generally comprises a masked etch. This mask level represents the only added mask level needed to add disclosed trench-based MIM capacitors to an IC process already having a multi-level metal stack.

The bottom plate contact 240a is shown including an optional surrounding shield that is connected to a circuit node in the IC to avoid floating which can cause added noise, where the shield can comprise a metal portion 240b coupled by a metal filled contact 207 (e.g., comprising W) that shown with a liner 207a (e.g., a refractory metal comprising liner) coupled to a p+ contact 206 in the semiconductor surface layer 209 in the case the semiconductor surface layer 209 is p-type. An optional field dielectric shown as shallow trench isolation (STI) 203 is also shown under the bottom plate contact 240a. The field dielectric can also be local oxidation of silicon (LOCOS).

Figure 2B:
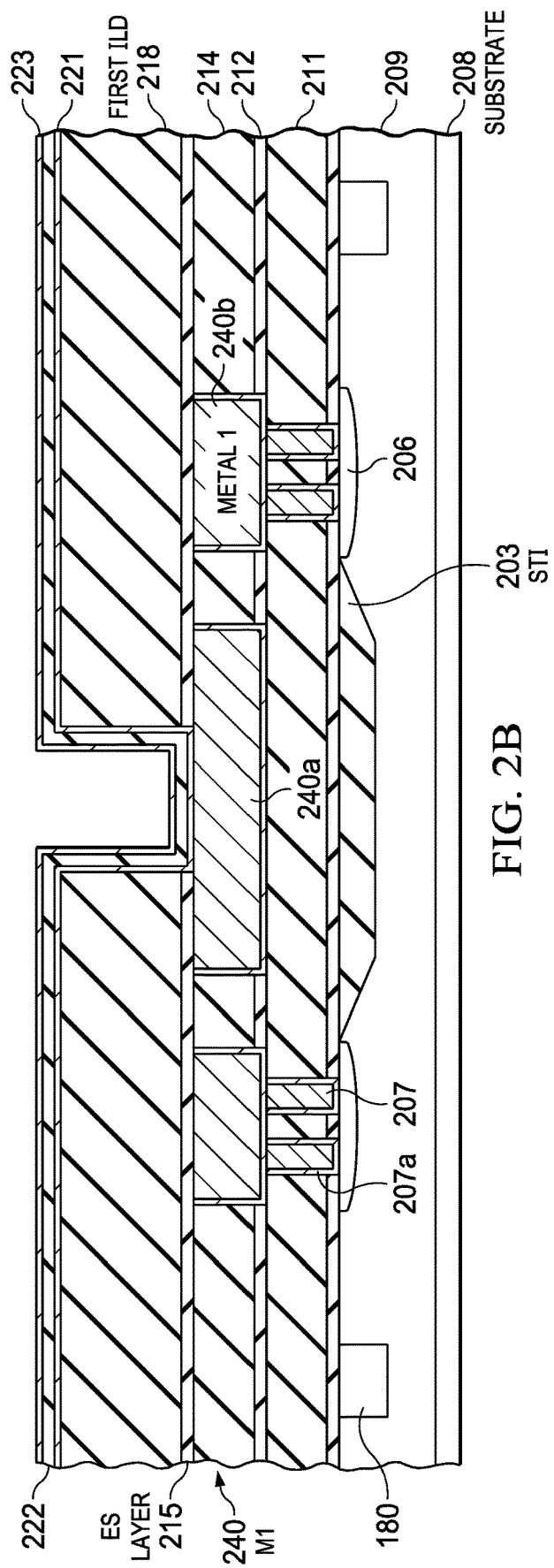

Step 103 comprises depositing including in the trench 237 a bottom capacitor plate layer 221, then at least one capacitor dielectric layer 222, and then a top capacitor plate layer 223, with the in-process IC result shown in FIG. 2B. As noted above the bottom capacitor plate layer 221 and top capacitor plate layer 223 can each be selected from a variety of electrically conductive materials, such as Ta, Ti, TaN, TiN, Ni, W, WN, Pt, Co, CoSi or Ir, both these layers generally being between 50 Å and 500 Å thick.

The capacitor dielectric layer 222 is generally formed by a deposition process such as low pressure chemical vapor deposition (LPCVD), plasma enhanced CVD (PECVD) or Atomic layer deposition (ALD), and can comprise a single layer or a dielectric stack with 2 or more dielectric layers. The capacitor dielectric layer(s) 222 can comprise a high-k dielectric layer defined herein having a k-value of at least that of silicon nitride (k>7) so that its k-value is above that of silicon dioxide (k-value of 3.9), silicon dioxide-nitride-silicon dioxide (ONO), NON, oxide, nitride which refers to herein to silicon nitride or SiON, or a multi-layer dielectric stack (e.g., ONON, or ONONO). One capacitor dielectric stack comprises ONO. The total thickness of the capacitor dielectric layer(s) 222 is generally in a range from 20 Å to 2,000 Å.

The nitride layer (e.g., silicon nitride or a silicon oxynitride) in the case of a capacitor dielectric stack can have a hydrogen concentration of ≤18 atomic %. This hydrogen concentration in the nitride layer is lower as compared to the hydrogen concentration in a conventional silicon nitride or silicon oxynitride layer that is generally 20 to 30 atomic %. It is recognized herein that a relatively low hydrogen content in the nitride layer in a capacitor dielectric stack provides improved voltage linearity for the MIM capacitor including a low $|\beta|$ value and a low $|(\alpha)|$ value.

The deposition process to obtain a low hydrogen concentration nitride layer can comprise CVD such as LPCVD or PECVD, where the gases used include a nitrogen source comprising at least one nitrogen compound other than $N_2$ as well as $N_2$, and where a mass flow of the $N_2$ is at least 51% of a mass flow of the nitrogen source. For one particular example, PECVD silicon nitride may be deposited at a deposition temperature range of 300° C. to 500° C. with an $N_2$ mass flow rate in a range of 3,000 sccm to 10,000 sccm, a $NH_3$ mass flow rate of 200 to 1,000 sccm, a $SiH_4$ mass flow rate of 20 to 200 sccm, at a pressure of 2 to 6 Torr while applying RF-low frequency (LF) power and RF-high frequency (HF) power. The RF-LF power can be in a frequency range of 50 kHz to about 500 kHz, for example, 400 kHz in a power range of 10 W to 200 W, and the RF-HF power can be in a frequency range of 10 MHz or more, for example, 13.65 MHz in a power range of 50 W to 400 W.

Figure 2C:
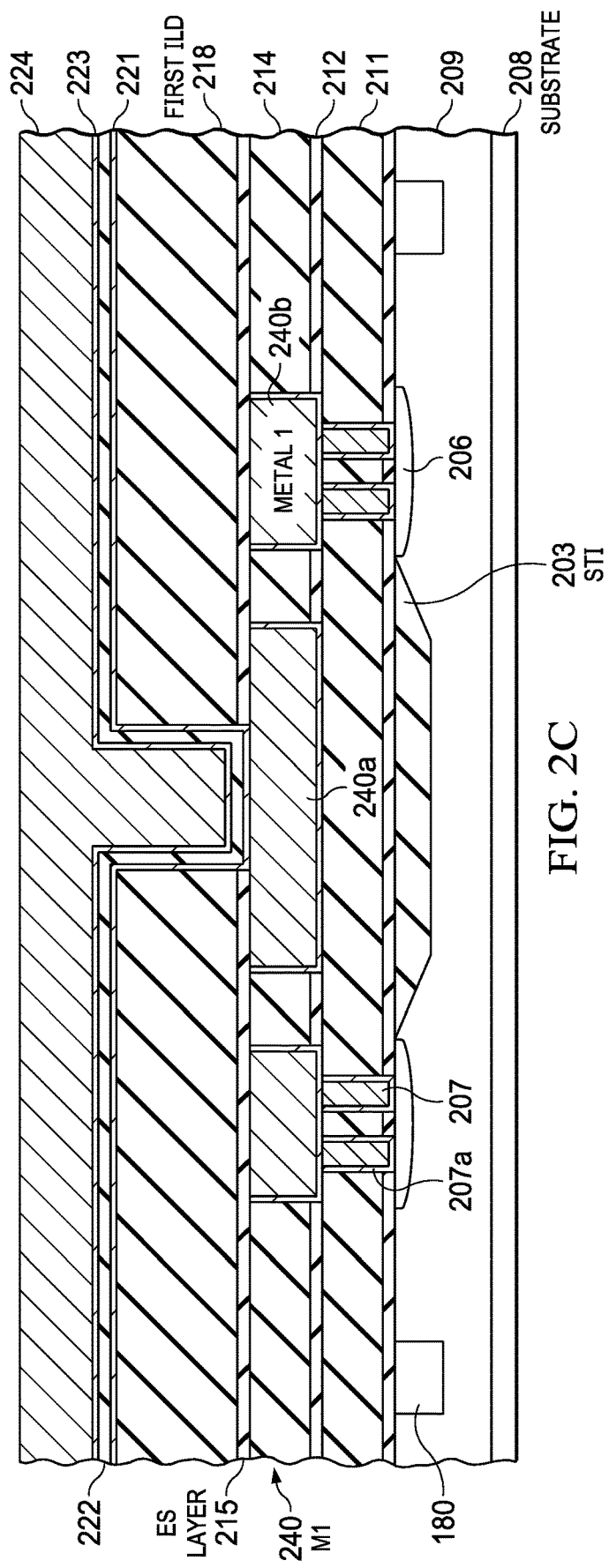
Figure 2D:
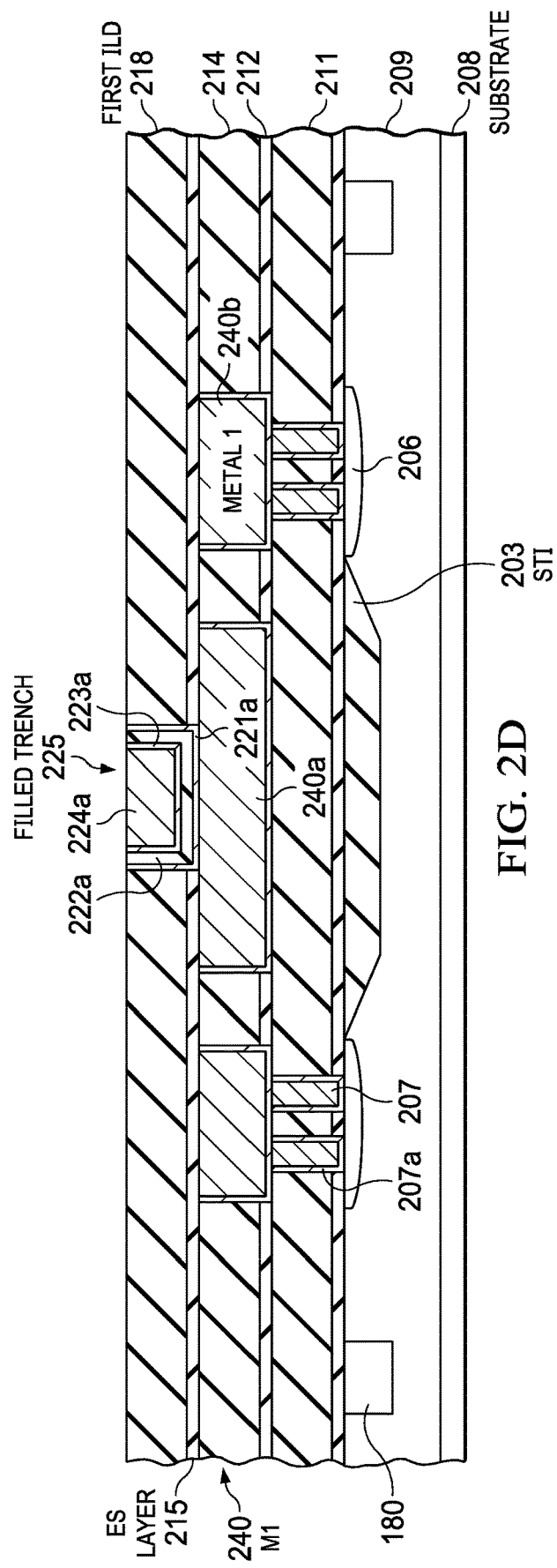

Step 104 comprises filling the trench with at least one fill material to form a filled trench 225. FIG. 2C shows the in-process IC after step 104 where the fill material is shown as a metal layer 224, such as comprising W, Cu, Al, Ni, or Ta. In the case of a metal fill material, a typical thickness range is 2 kA to 3 kA. Step 105 comprises removing the fill material 224 lateral to the filled trench 225 and then a portion of the first ILD layer 218, and defining the top capacitor plate layer 223 to form a top capacitor plate 223a, defining the capacitor dielectric layer 222 to form a patterned capacitor dielectric layer 222a, defining the bottom capacitor plate layer 221 to form a bottom capacitor plate 221a, and to expose a contact to the top capacitor plate shown as top plate contact 224a, with the in-process result shown in FIG. 2D. The removing can comprise chemical mechanical polishing (CMP) or an etch process. The removing can be a single pass or multiple pass CMP, or be an etch process. The target range for thickness of filled trench 225/first ILD layer 218 after the etch back or CMP that defines the height of the trench-based MIM capacitor can be nominally about 1.7 kA, and vary in height depending on the initial thickness of the first ILD layer 218 and the etch or CMP process to generally have a height of 1.5 kA to 3.0 kA.

Figure 2E:
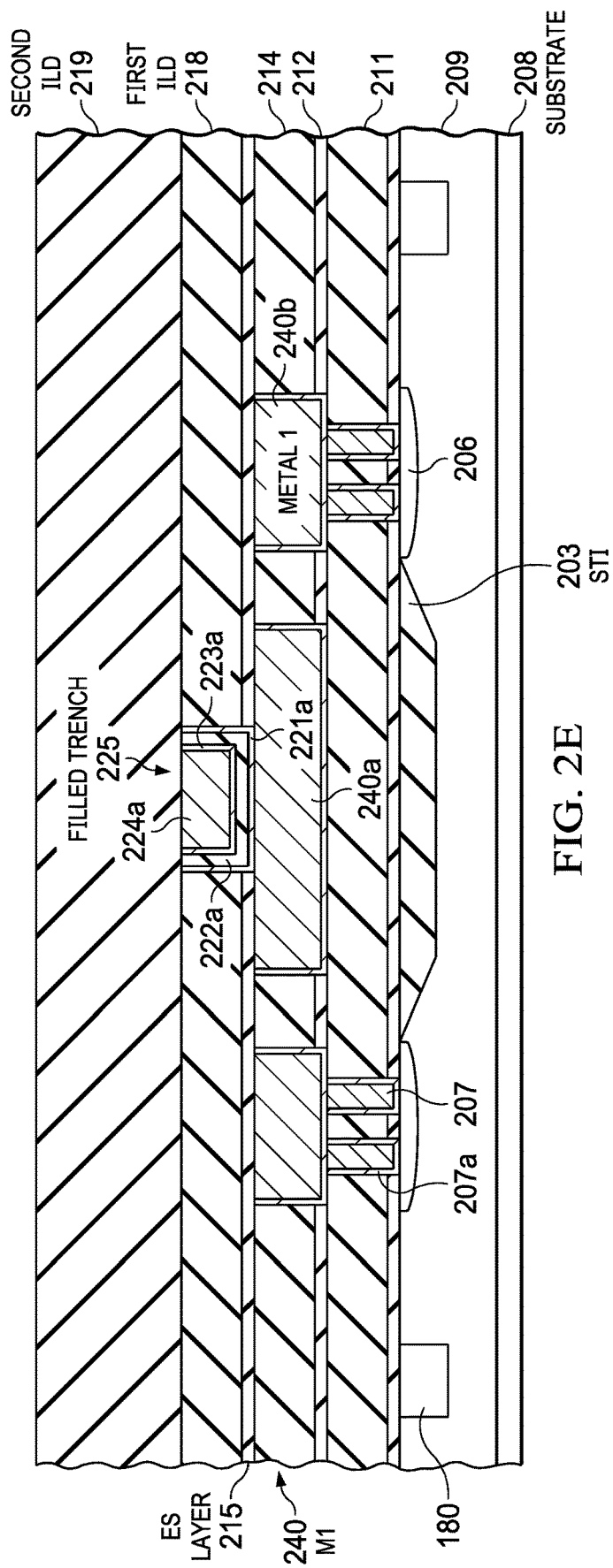

Step 106 comprises forming a second ILD layer 219 including over the filled trench 225 with the result shown in FIG. 2E. A CVD-based deposition process can be used to form second ILD layer 219, such as using a TEOS-based deposition process. Step 107 comprises etching vias including a via 231 through the second ILD layer 219 to reach the top plate contact 224a, and another via 232 through both the second ILD layer 219 and first ILD layer 218 to optionally reach the metal shield portion 240b of the metal shield, with the in-process IC results shown in FIG. 2F. The vias 231, 232 shown have a relatively wide top portion relative to their bottom portion which is narrower. This shape can be obtained using a baseline etch chemistry process such as utilizing $C_5F_8/O_2/Ar$ which typically provides a tapered via profile.

Figure 2F:
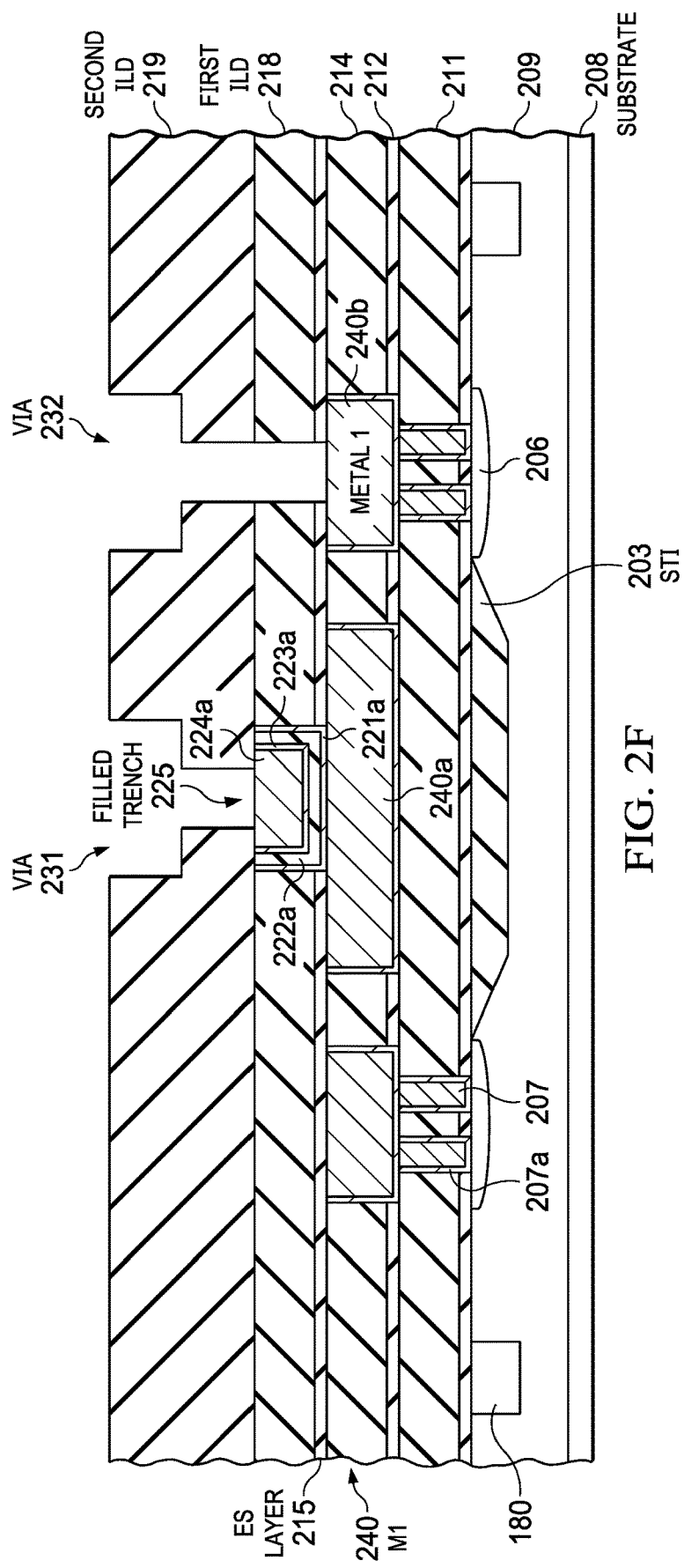
Figure 2G:
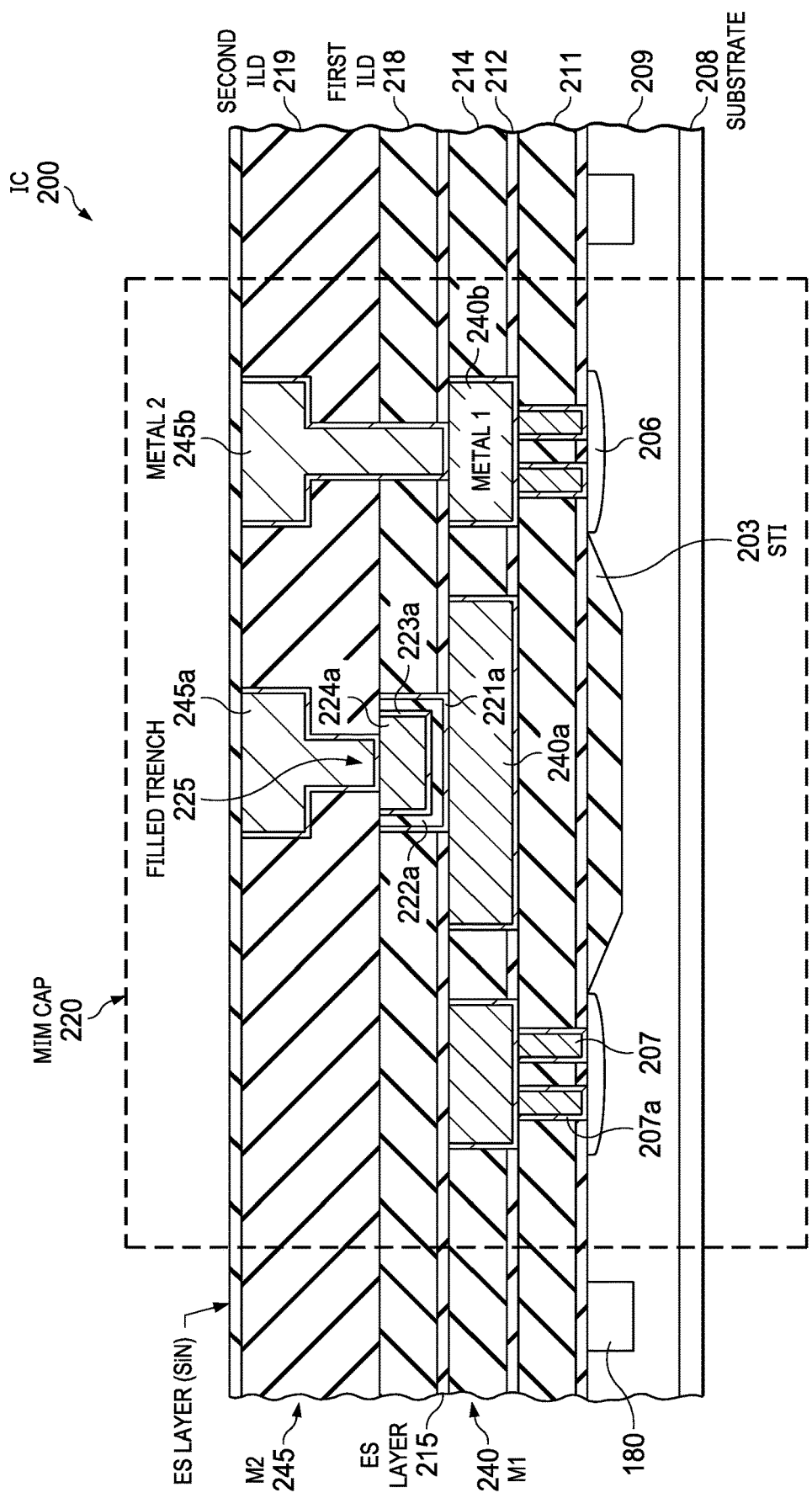

Step 108 comprises filling the vias 231, 232 with a metal 2 (M2) layer 245 including a via plug 245a contacting the top plate contact 224a, and a via plug 245b contacting the metal shield portion 240b, with the in-process IC result shown in FIG. 2F. Although not shown, contact to the bottom plate contact 240a is generally provided by a metal to via connection to the bottom plate contact metal layer shown as the M1 layer 240 analogous to the contact made to the metal shield portion 240b.

The wafer processing can then be completed by conventional backend of the line (BEOL) processing comprising forming one or more additional metal levels (e.g., M3, M4, . . . ) including a top metal level that generally provides bond pads. The top metal layer can comprise aluminum (or an aluminum alloy) or copper. Passivation overcoat (PO) then generally follows, followed by patterning the PO layer(s) to expose the bond pads. The PO layer can comprise silicon oxide, silicon nitride, or SiON.

Figure 3A:
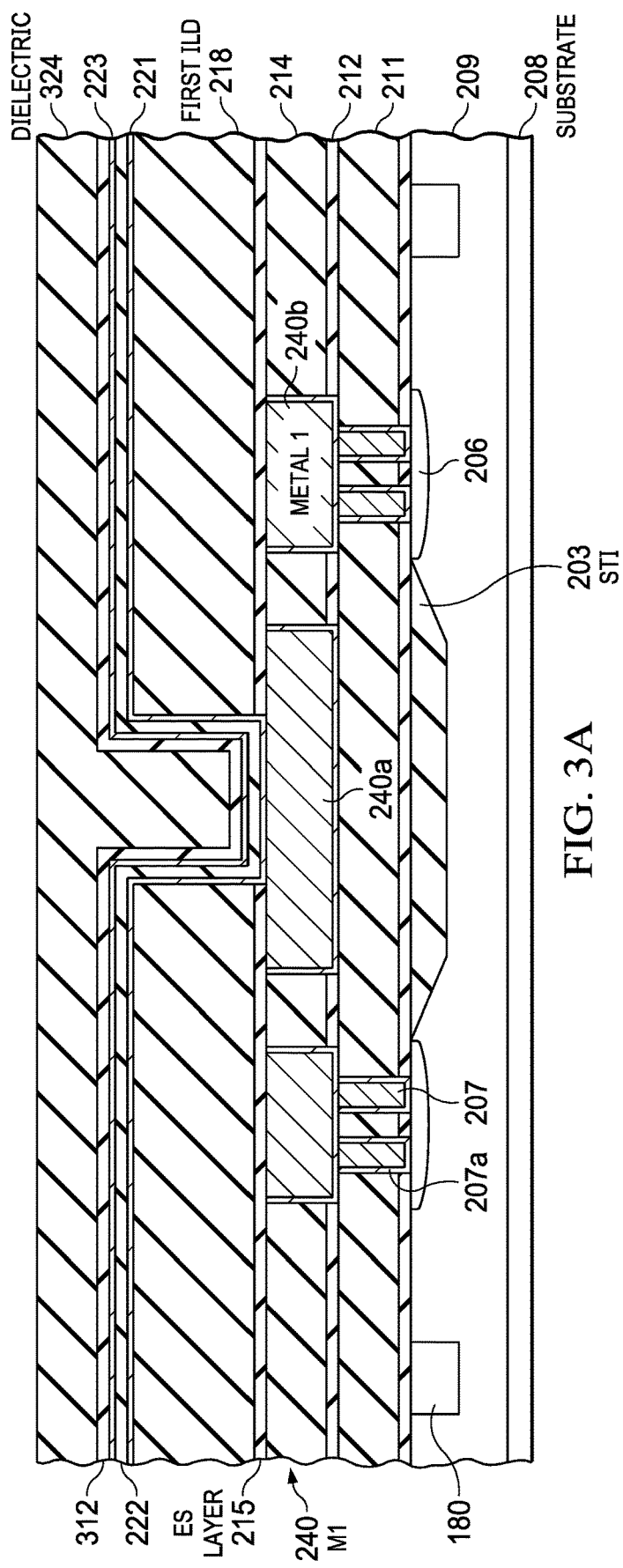
FIGS. 3A-E show successive cross-sectional depictions for a second flow option for forming an example trench-based MIM capacitor on an IC that utilizes a dielectric fill for the fill material, according to an example aspect.

FIGS. 3A-E show successive cross-sectional depictions for a second flow option for forming an example trench-based MIM capacitor on an IC that utilizes a dielectric fill material 324 (instead of a metal fill material described above relative to FIGS. 2A-2G) to form the filled trench, according to an example aspect. FIG. 3A shows the in-process IC after depositing an etch stop layer 312 then the dielectric fill material 324 over the in-process IC structure shown in FIG. 2B described above. The dielectric fill material 324 can be deposited by a TEOS-based process. A thickness range for the dielectric fill material 324 can be 5 kA to 8 kA, such as 7 kA to 7.5 kA (before CMP or etch).

Figure 3B:
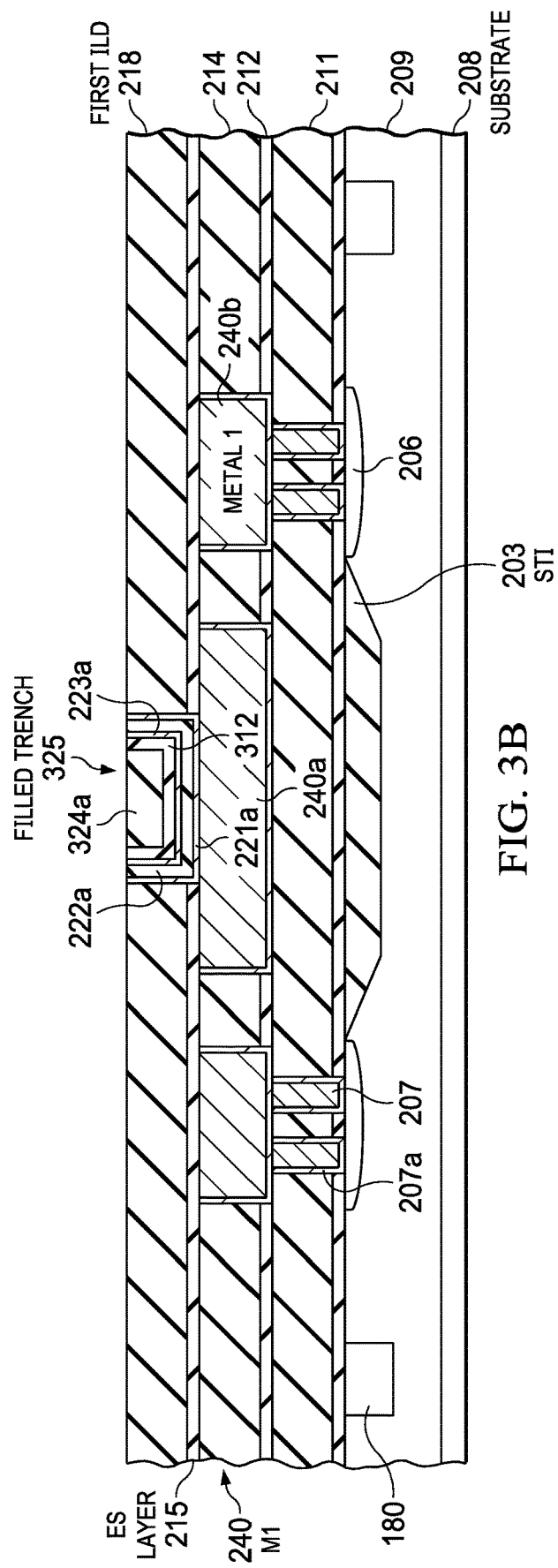

As described above step 105 comprises removing the fill material, in this aspect being the dielectric fill material 324, lateral to the filled trench and then a portion of the first ILD 218, and defining the top capacitor plate layer 223 to form a top capacitor plate 223a, defining the capacitor dielectric layer 222 to form a patterned capacitor dielectric layer 222a, defining the bottom capacitor plate layer 221 to form a bottom capacitor plate 221a, and to expose a contact to the top capacitor plate shown as top plate contact 324a, with the in-process result shown in FIG. 3B including a filled trench 325. The removing can comprise chemical mechanical polishing (CMP) or an etch process.

Figure 3C:
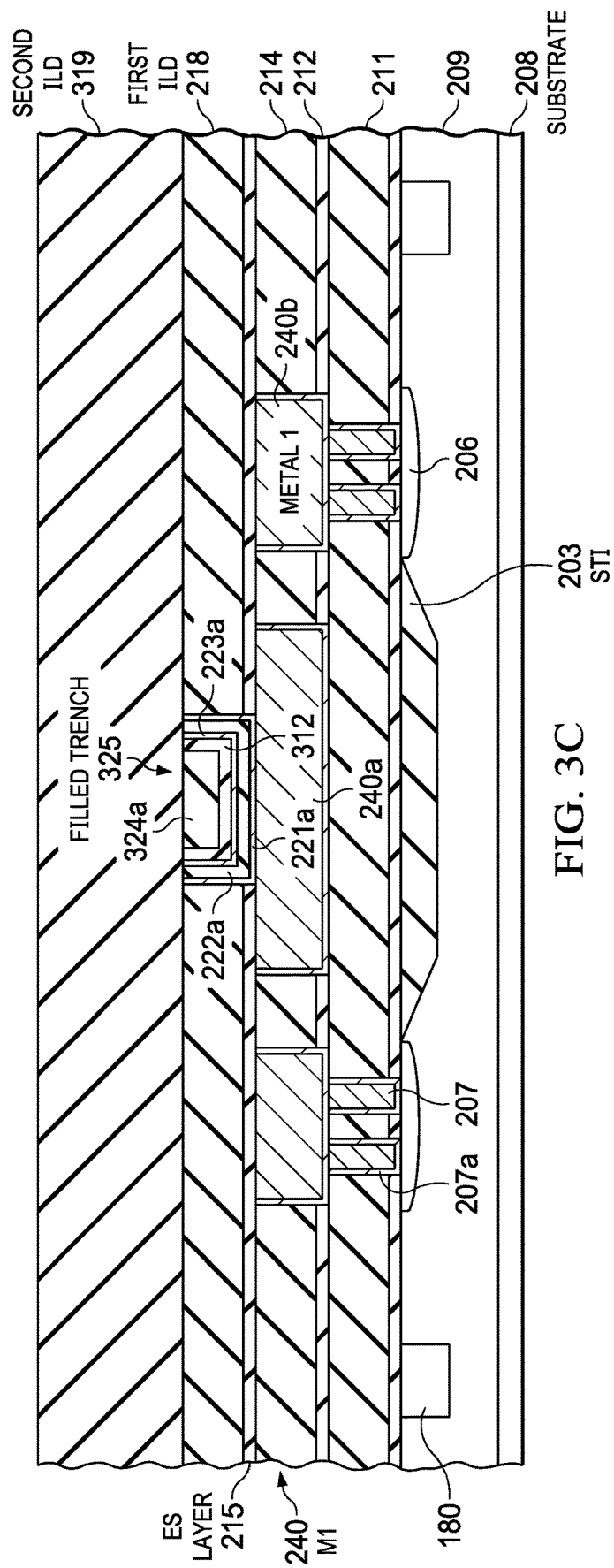
Figure 3D:
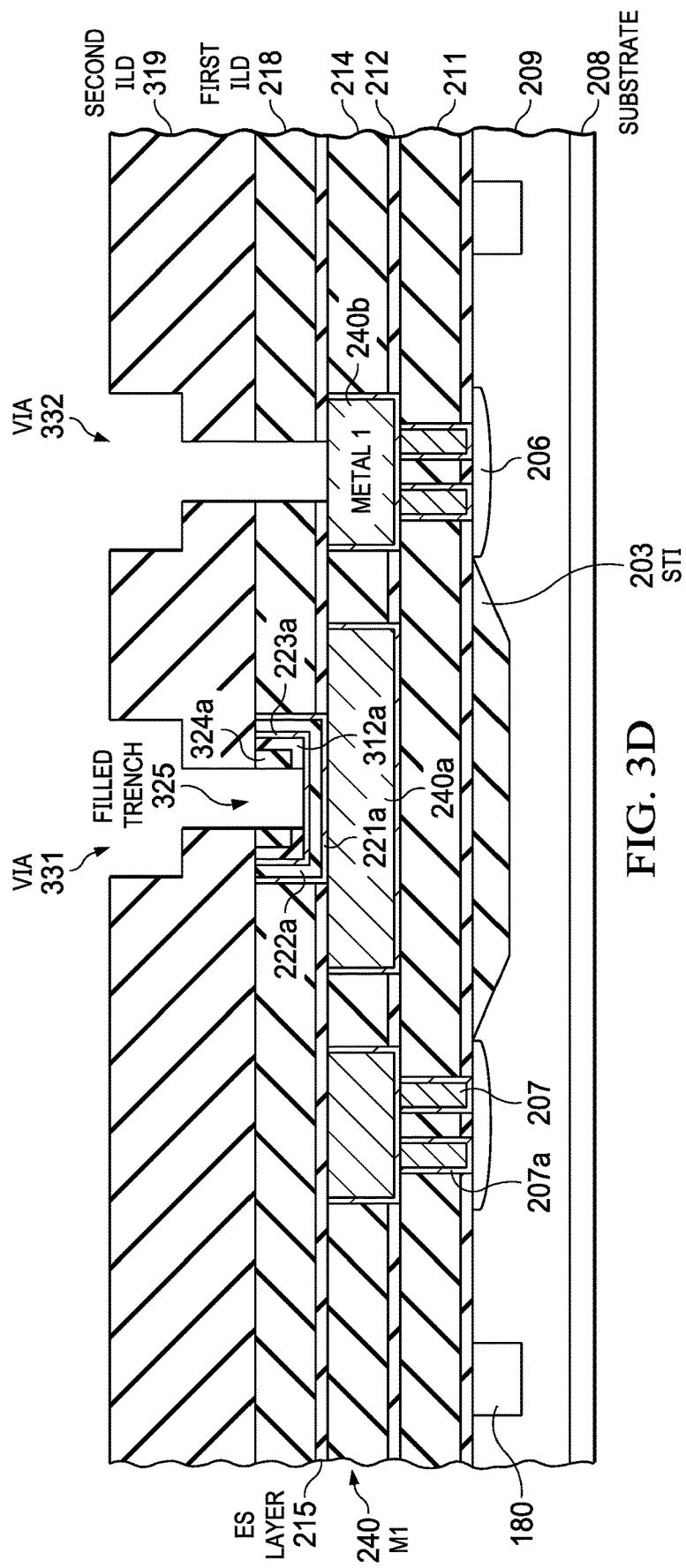
Figure 3E:
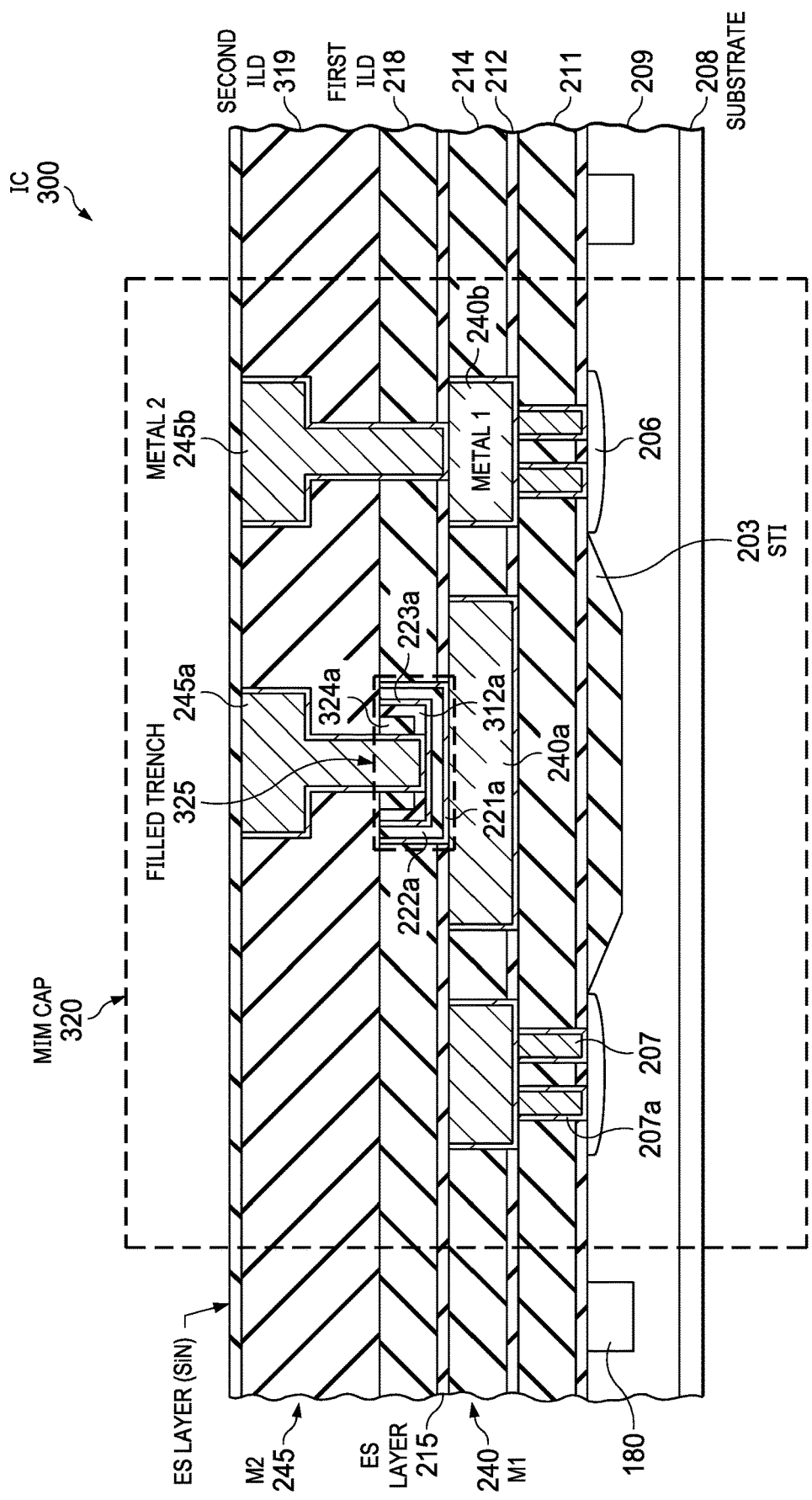

Step 106 as with the metal fill process described above comprises forming a second ILD layer now shown as 319 including over the filled trench with the result shown in FIG. 3C. Step 107 comprises etching vias including etching a via 331 through the second ILD layer 219 and the etch stop layer 312 to form patterned etch stop layer 312a to reach the top capacitor plate 223a to provide a contact, and another via 332 through the second ILD layer 219 and first ILD layer 218 to reach the metal portion 240b of the metal shield, with the in-process IC result after step 107 shown in FIG. 3D. Step 108 comprises filling the vias 331, 332 with a metal layer with via plug 245a directly contacting the top capacitor plate 223a, and a via plug 245b again contacting metal layer 240b, with the in-process IC result shown in FIG. 3E as IC 300 with MIM capacitor 320 shown as MIM cap. As with IC 200 described above, although not shown, contact to the bottom plate contact 240a is generally provided by a metal to via connection to M1 layer 240 analogous to the contact made to metal shield portion 240b.

Figure 4:
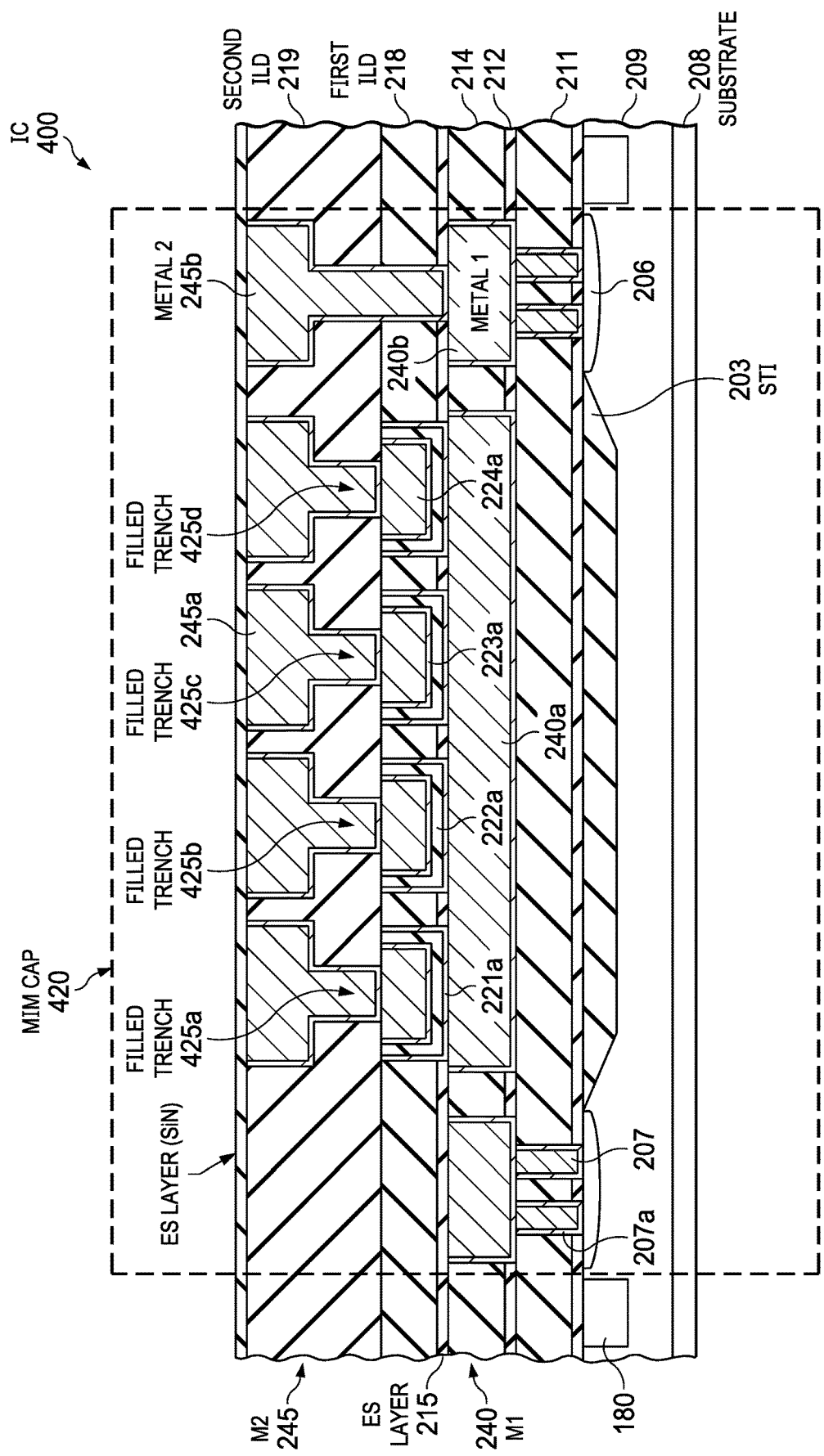
FIG. 4 depicts an example IC including a trench-based MTM capacitor having a two-dimensional (2D) array of trenches.

Although disclosed trench-based MIM capacitors can consist of a single trench, disclosed trench-based MIM capacitors generally comprise a 2D array of filled trenches to maximize the capacitance with contributions from each filled trench from both their side walls and bottom. FIG. 4 depicts an example IC 400 including a trench-based MIM capacitor 420 having an interconnected 2D array of filled trenches in one of its dimensions shown as 425a, 425b, 425c and 425d.

The 3D topography enabled by disclosed trench-based MIM capacitor integration schemes described herein can achieve C/A ratios as high as 20× larger than what can be achieved by conventional planar MIM capacitors. The higher the aspect ratio (AR) of the trench(es), the higher the capacitance provided. Disclosed trench-based MIM caps generally provide a capacitance/area (C/A) value of >1.5 $fF/\mu m^2$, such as a C/A value in the range of 2 $fF/\mu m^2$ to 10 $fF/\mu m^2$, typically 3 to 5 fF/um².

For a conventional IC having a multi-layer metal stack the via trench and CMP process already available as a part of a copper BEOL process can be taken advantage of to realize a disclosed trench-based MIM capacitor with only one additional mask, that being for the trench etch. Conventional barrier layer materials (e.g., Ta/TaN) for copper can be used as the top plate 223a and the bottom capacitor plate 221a for the trench-based MIM capacitor. Due to the additional thickness of the trench-based MIM capacitors due to a thickness of the bottom capacitor plate 221a, a thickness of the patterned capacitor dielectric layer 222a, and thickness of the top plate 223a, to contact the top plate 223 there is a reduced height, that being less than a full height via trench (M2 245 to M1 240) used by the shield comprising metal portion 240b. For IC 200 the height of the via trench for contact to the top plate 223a is even less than for IC 300 due to the added thickness of the top plate contact 224a that is over the top plate 223a. Therefore, in either case of IC 200 or 300, instead of the entirety of a conventional via trench (M2 245 to M1 240), a more robust capacitor is created by reducing chances of shorting between top plate 223a and the bottom capacitor plate 221a of the trench-based MIM capacitor. The reduced trench depth also enables a more uniform deposition of the capacitor dielectric layer 222 to enable forming a more uniform patterned capacitor dielectric layer 222a and the plates 221a, 223a on the trench sidewalls thus reducing the variation in capacitance for the trench-based MIM capacitor.

As described above, after the top electrode deposition the trench can either be filled with a dielectric material or by a metal. This flexibility in fill material enables relatively easy process integration with reduced contamination concerns and reduces issues due to etch topography and alignment. As described above, alternate materials such as Ti/TiN can be used as the top electrode to enable trenches to be filled with W to reduce alignment problems and equivalent series resistance (ESR). By using TiN over TaN for the bottom plate also can improve the symmetry of capacitor characteristics over the voltage range since the top and bottom interface is the same.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. An integrated circuit (IC), comprising:
a semiconductor surface layer of a substrate including circuitry comprising circuit elements formed in the semiconductor surface layer configured together with a Metal-Insulator-Metal (MIM) capacitor;
a multi-layer metal stack on the semiconductor surface layer including a bottom plate contact metal layer including a bottom capacitor plate contact, and a first inter level dielectric (ILD) layer over the bottom plate contact metal layer;
the MIM capacitor comprising:
a trench in the first ILD layer over the bottom capacitor plate contact, wherein the trench is lined by a bottom capacitor plate with a capacitor dielectric layer thereon, and a top capacitor plate on the capacitor dielectric layer;
a fill material filling the trench to form a filled trench, a second ILD layer including over the filled trench, and a filled via through the second ILD layer that provides a contact to the top capacitor plate.

2. The IC of claim 1, wherein the fill material comprises tungsten and wherein the filled via extends to the tungsten to provide the contact to the top capacitor plate.

3. The IC of claim 1, wherein the fill material comprises a dielectric material and wherein the filled via extends through the fill material.

4. The IC of claim 1, wherein the bottom capacitor plate and the top capacitor plate both comprise a refractory metal comprising layer.

5. The IC of claim 1, wherein the MIM capacitor provides a capacitance/area (C/A) value that is 2 to 10 fF/$\mu m^2$.

6. The IC of claim 1, wherein the capacitor dielectric layer comprises a dielectric stack comprising a first silicon dioxide layer, a nitride layer, and a second silicon dioxide layer.

7. The IC of claim 1, wherein a thickness of the capacitor dielectric layer is 20 A to 2,000 A.

8. The IC of claim 1, wherein the bottom plate contact metal layer comprises metal 1 and wherein the filled via comprises metal 2.

9. The IC of claim 1, wherein the bottom capacitor plate and the top capacitor plate both comprise a refractory metal comprising layer, and wherein a thickness of the bottom capacitor plate and top capacitor plate are both 50 A to 500 A thick.

10. The IC of claim 1, wherein at least the bottom plate contact metal layer comprises copper.

11. The IC of claim 1, wherein the MIM capacitor comprises a two-dimensional array of the filled trenches.

12. The IC of claim 1, wherein the capacitor dielectric layer comprises a dielectric stack, further comprising an etch stop layer in the dielectric stack.

13. An integrated circuit (IC) including a Metal-Insulator-Metal (MIM) capacitor, comprising:
a lower metal interconnect level over a substrate, the lower metal interconnect level having a bottom plate contact and a first metal portion;
a first dielectric layer over the lower metal interconnect level;
a trench in the first dielectric layer;
a bottom capacitor plate layer, a capacitor dielectric layer, and a top capacitor plate layer in the trench;
a metal fill layer over the top capacitor plate layer, the metal fill layer filling the trench;
a second dielectric layer over the first dielectric layer and the metal fill layer;
an upper metal interconnect level having a second metal portion, a third metal portion, a first via and a second via, the first via extending between the second metal portion and the metal fill layer and the second via extending between the third metal portion and the first metal portion.

14. The IC of claim 13, wherein the capacitor dielectric layer comprises a dielectric stack comprising a first silicon dioxide layer, a nitride layer, and a second silicon dioxide layer, and wherein the depositing the nitride layer comprises low pressure chemical vapor deposition (LPCVD) or plasma enhanced CVD (PECVD), or Atomic Layer Deposition (ALD).

15. The IC of claim 13, wherein a thickness of the capacitor dielectric layer is 2 nm to 200 nm.

16. The IC of claim 13, wherein the metal fill layer comprises tungsten.

17. The IC of claim 13, wherein the bottom capacitor plate layer and the top capacitor plate layer both comprise a refractory metal.

18. An integrated circuit (IC) including a Metal-Insulator-Metal (MIM) capacitor, comprising:
a lower metal interconnect level over a substrate, the lower metal interconnect level having a bottom plate contact and a first metal portion;
a first dielectric layer over the lower metal interconnect level;
a trench in the first dielectric layer;
a bottom capacitor plate layer, a capacitor dielectric layer, and a top capacitor plate layer in the trench;
a dielectric fill layer over the top capacitor plate layer, the dielectric fill layer filling the trench;

a second dielectric layer over the first dielectric layer and the dielectric fill layer;

an upper metal interconnect level having a second metal portion, a third metal portion, a first via and a second via, the first via extending through the second dielectric layer and the dielectric fill layer between the second metal portion and the top capacitor plate layer and the second via extending through the first dielectric layer and the second dielectric layer between the third metal portion and the first metal portion.

19. The IC of claim 18, wherein the capacitor dielectric layer comprises a dielectric stack comprising a first silicon dioxide layer, a silicon nitride layer, and a second silicon dioxide layer, and wherein the depositing the nitride layer comprises low pressure chemical vapor deposition (LPCVD) or plasma enhanced CVD (PECVD), or Atomic Layer Deposition (ALD).

20. The IC of claim 18, wherein the bottom capacitor plate layer and the top capacitor plate layer both comprise a refractory metal.

21. An integrated circuit (IC), comprising:
a lower metal interconnect level over a substrate, the lower metal interconnect level having a first metal portion and a second metal portion;
a first dielectric layer over the lower metal interconnect level;
a trench in the first dielectric layer over the first metal portion;
a metal-insulator-metal (MIM) capacitor in the trench, the MIM capacitor having bottom capacitor plate, a capacitor dielectric, a top capacitor plate, and a fill layer in the trench;
a second dielectric layer over the first dielectric layer and the fill layer;
an upper metal interconnect level having a third metal portion, a fourth metal portion, a first via and a second via, the first via extending through the second dielectric layer between the third metal portion and the MIM capacitor and the second via extending through the first dielectric layer and the second dielectric layer between the fourth metal portion and the second metal portion.

22. The IC of claim 21, wherein the fill layer comprises a metal.

23. The IC of claim 21, wherein the fill layer comprises tungsten.

24. The IC of claim 21, wherein the fill layer comprises a dielectric material.

25. The IC of claim 21, wherein a width of the first via is less than a width of the fill layer in the trench and a width of the trench is less than a width of the first metal portion.

* * * * *